(12) United States Patent
Nanao et al.

(10) Patent No.: US 6,685,850 B2
(45) Date of Patent: Feb. 3, 2004

(54) PIEZOELECTRIC CERAMIC MATERIAL

(75) Inventors: Masaru Nanao, Chuo-ku (JP);
Masakazu Hirose, Chuo-ku (JP);
Takeo Tsukada, Chuo-ku (JP)

(73) Assignee: TDK Corporation, Tokyo (JP)

( * ) Notice: Subject to any disclaimer, the term of this patent is extended or adjusted under 35 U.S.C. 154(b) by 28 days.

(21) Appl. No.: 09/915,347

(22) Filed: Jul. 27, 2001

(65) Prior Publication Data

US 2002/0035027 A1 Mar. 21, 2002

(30) Foreign Application Priority Data

Jul. 28, 2000 (JP) .................................. 2000-228514
Aug. 9, 2000 (JP) .................................. 2000-241826
Sep. 28, 2000 (JP) .................................. 2000-296992
Mar. 22, 2001 (JP) .................................. 2001-083778

(51) Int. Cl.⁷ .................... C04B 35/01; C04B 35/462
(52) U.S. Cl. .................... 252/62.9 PZ; 252/62.9 R; 501/134; 501/135; 501/136; 501/137; 501/138; 501/139
(58) Field of Search .................... 252/62.9 PZ, 62.9 R; 501/134, 135, 136, 137, 138, 139

(56) References Cited

U.S. PATENT DOCUMENTS 6,080,327 A * 6/2000 Takenaka et al. ...... 252/62.9 R
6,117,354 A * 9/2000 Kimura et al. ......... 252/62.9 R

OTHER PUBLICATIONS

"A Research Report on Trends in Piezoelectric Materials", The Association of Electronic Materials, Mar. 1976. Considered to the Extent of Discussion in Specification.
Pardo et al, *Acta Mater*, 2000, vol. 48, pp. 2421–2428.
Jimenez et al, *Journal of the European Ceramic Society*, 1999, vol. 19, pp. 1315–1319.
Jimenez et al, *Ferroelectrics*, 2000, vol. 241, pp. 279–286.
Subbarao, *J. Phys. Chem. Solids*, 1962, vol. 23, pp. 665–676.

* cited by examiner

*Primary Examiner*—Elizabeth D. Wood
(74) *Attorney, Agent, or Firm*—Oblon, Spivak, McClelland, Maier & Neustadt, P.C.

(57) ABSTRACT

The invention provides a piezoelectric ceramic material comprising a $Bi_3TiNbO_9$ crystal and/or an $MBi_2Nb_2O_9$ crystal which are each a bismuth layer compound, where M represents at least one element selected from Sr, Ba and Ca. The ceramic material contains Bi, Ti, M and Nb as main component elements. The molar ratio as oxides of the main component elements is given by $(Bi_{3-x}M_x)_z(Nb_{1+y}Ti_{1-y})O_9$ provided that $0<x$, $y\leq0.8$ and $0.95\leq z\leq 1.05$. When the molar ratio of Ba/(M+Bi) is given by $x_B/3$ and the molar ratio of Ca/(M+Bi) is given by $x_C/3$, it is required that $0\leq x_B\leq 0.5$ and $0\leq x_C<0.4$. This piezoelectric ceramic material, free from any lead whatsoever, has a sufficiently high Curie point, and exhibits ever more improved piezoelectric properties.

11 Claims, 4 Drawing Sheets

PIEZOELECTRIC CERAMIC MATERIAL

BACKGROUND OF THE INVENTION

1. Field of the Art

The present invention relates to a piezoelectric ceramic material having the potential to find wide applications in fields including resonators and high-temperature pressure sensors.

2. Background Art

A piezoelectric material has the piezoelectric effect that causes an electric polarization change when it receives external stresses and the inverse piezoelectric effect that causes distortion at an applied electric field. Piezoelectric materials are now applied to sensors, resonators, actuators, etc.

Piezoelectric materials currently put to practical use, for the most part, are generally provided by ferroelectric materials having perovskite structures based on tetragonal or rhombohedral crystal system PZT ($PbZrO_3$-$PbTiO_3$ solid solutions) or tetragonal crystal system PT ($PbTiO_3$). To meet a variety of requirements, a variety of subordinate components are added to these materials.

However, most of PZT or PT piezoelectric materials have Curie points of the order of 200 to 400° C. on practical compositions, and have difficulty in high-temperature applications because they become normal dielectric materials and lose their piezoelectric properties at temperatures higher than those. These lead-base piezoelectric materials are also not preferable in view of ecological consideration and prevention of pollution, because of containing a large amount (about 60 to 70% by mass) of lead oxide (PbO) having extremely high vaporization even at low temperatures. For instance, when these lead-base piezoelectric materials are produced in the form of ceramics or single crystals, very large amounts—even on industrial levels—of vaporous lead oxide are released by vaporization and diffusion into the atmosphere through unavoidable thermal treatments such as firing and melting. Lead oxide released during material production may be recovered; however, lead oxide contained in piezoelectric commodities on the market can hardly be done under the present situations. This lead oxide, when spewed into the environment over a wide area, would result inevitably in air pollution.

For piezoelectric materials that do not contain lead at all, for instance, $BaTiO_3$ having a perovskite structure belonging to the tetragonal crystal system is well known. However, this material is less than practical because of having a Curie point as low as 120° C.

For piezoelectric materials having a relatively high Curie point, for instance, a bismuth layer compound is known. The bismuth layer compound is represented by the following general formula:

$$(Bi_2O_2)^{2+}(A_{m-1}B_mO_{3m+1})^{2-}$$

In this general formula, the element A is Ca, Sr, Ba or the like and the element B is Ti, Nb, Ta, W or the like. Referring to the bismuth layer compound, the c axis of the crystal is longer than the a and b axes and the more the value of m in the aforesaid general formula, the longer the c axis is. For compounds represented by the aforesaid general formula where m=2, for instance, $SrBi_2Nb_2O_9$, $BaBi_2Nb_2O_9$ and $CaBi_2Nb_2O_9$ are known (A RESEARCH REPORT ON TRENDS IN PIEZOELECTRIC MATERIALS, Table 4, page 17 published by the Association of Electronic Material in March 1976). JP-A 11-322426 discloses a piezoelectric ceramic composition comprising $SrBi_2Nb_2O_9$ and Mn added thereto in amount of 1.0% by weight or less as calculated on an $MnCO_3$ basis, and states that the electromechanical coupling factor is improved by the addition of Mn. Until now, however, no prior art shows that $BaBi_2Nb_2O_9$ and $CaBi_2Nb_2O_9$ have piezoelectric properties.

Most of bismuth layer compounds, because of having high Curie points, have properties satisfactory enough for high-temperature sensors. However, a problem with some bismuth layer compounds free from lead whatsoever is that their $Q_{max}$ important for resonators is small. Here $Q_{max}$ is defined by $\tan\theta_{max}$ where $\theta_{max}$ is the maximum value of a phase angle. That is, $Q_{max}$ is the maximum value of Q (=$|X|/R$) between a resonant frequency and an anti-resonant frequency, where X is reactance and R is resistance. The larger $Q_{max}$ or the closer $\theta_{max}$ is to 90°, the more stable oscillation is and the lower is the temperature at which oscillation occurs.

An object of the present invention is to provide a piezoelectric ceramic that is free from lead, has a high enough Curie point and possesses improved piezoelectric properties.

SUMMARY OF THE INVENTION

This object is achievable by the following embodiments (1) to (3) of the present invention.

(1) A piezoelectric ceramic material comprising a $Bi_3TiNbO_9$ crystal and/or an $MBi_2Nb_2O_9$ crystal which are each a bismuth layer compound, where M represents at least one element selected from Sr, Ba and Ca, and containing Bi, Ti, M and Nb as main component elements, wherein a molar ratio as oxides of said main component elements is given by $(Bi_{3-x}M_x)_z(Nb_{1+y}Ti_{1-y})O_9$ provided that $0 < x$, $y \leq 0.8$ and $0.95 \leq z \leq 1.05$, and $0 \leq x_B \leq 0.5$ and $0 \leq x_C \leq 0.4$ wherein a molar ratio of Ba/(M+Bi) is given by $x_B/3$ and a molar ratio of Ca/(M+Bi) is given by $x_C/3$.

(2) The piezoelectric ceramic material of (1) above, wherein $x-0.5 \leq y \leq x+0.5$.

(3) The piezoelectric ceramic material of (1) or (2) above, which further contains as a subordinate component element at least one element selected from La, Ce, Pr, Nd, Pm, Sm, Eu, Gd, Tb, Dy, Ho, Er, Tm, Yb, Lu, Ta, Zr, Cr, Fe and W.

According to the present invention, it is possible to achieve a piezoelectric ceramic material that is free from lead and has a high-enough Curie point and a large value for the aforesaid $Q_{max}$.

The key composition for the piezoelectric ceramic material of the invention is a solid solution of $Bi_3TiNbO_9$ and $MBi_2Nb_2O_9$. If the mixing ratio of $MBi_2Nb_2O_9$ in this solid solution is limited to within the range defined by the invention, then the value of $Q_{max}$ can be critically increased.

As already mentioned, $SrBi_2Nb_2O_9$ is a known piezoelectric material. However, the $Q_{max}$ of $SrBi_2Nb_2O_9$ is small, as can be appreciated from the comparative samples in the examples of the invention. As again mentioned above, no prior art shows that $BaBi_2Nb_2O_9$ and $CaBi_2Nb_2O_9$ have piezoelectric properties. Also, no prior art shows that $Bi_3TiNbO_9$ has piezoelectric properties. As can be appreciated from the comparative samples in the examples of the invention, the $Q_{max}$ of $Bi_3TiNbO_9$ is nearly close to zero. With the invention, it is possible to achieve an unexpected effect that some considerable large value is obtained for $Q_{max}$ by mixing $SrBi_2Nb_2O_9$ with limited $Q_{max}$ and $BaBi_2Nb_2O_9$ or $CaBi_2Nb_2O_9$ with nothing reported about their piezoelectric properties in $Bi_3TiNbO_9$ with nothing reported about its piezoelectric properties.

PREFERRED EMBODIMENTS OF THE INVENTION

Figure 1:
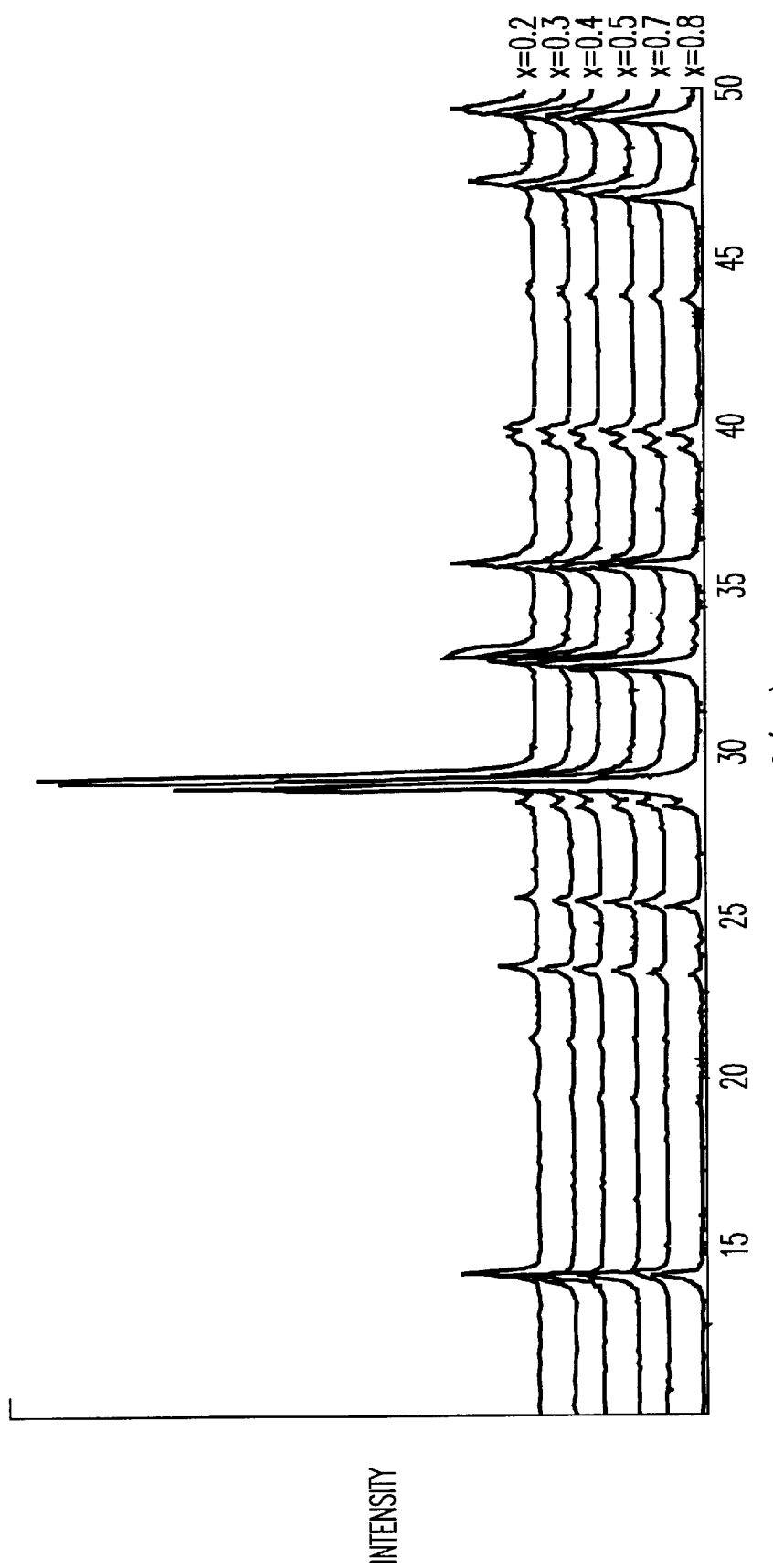
FIG. 1 is a chart illustrative of the results of analysis of powder X-ray diffraction of $(1-x)Bi_3TiNbO_9+xSrBi_2Nb_2O_9$ with varying x values.

The piezoelectric ceramic material of the invention is a composite oxide containing Bi, Ti, M and Nb as main component elements. The element M is at least one element selected from Sr, Ba and Ca. The molar ratio of the main component elements on an oxide basis is given by the following formula I:

$$(1-x)Bi_3TiNbO_9 + xMBi_2Nb_2O_9$$

The small letter x is the molar ratio indicative of the mixing ratio of $MBi_2Nb_2O_9$ with respect to the total of $Bi_3TiNbO_9$ and $MBi_2Nb_2O_9$. Here let $x_S$ represent the mixing ratio of $SrBi_2Nb_2O_9$, $x_B$ represent the mixing ratio of $BaBi_2Nb_2O_9$ and $x_C$ represent the mixing ratio of $CaBi_2Nb_2O_9$. Then, $$x = x_S + x_B + x_C$$

In the aforesaid formula I according to the invention,

| for x, | $0 < x \leq 0.8$ |
| --- | --- |
| | preferably $0.05 \leq x \leq 0.8$ |
| | more preferably $0.1 \leq x \leq 0.7$ |
| for $x_B$, | $0 \leq x_B \leq 0.5$ |
| | preferably $0 \leq x_B \leq 0.4$ |
| | more preferably $0 \leq x_B \leq 0.3$ |
| for $x_C$, | $0 \leq x_C < 0.4$ |
| | preferably $0 \leq x_C \leq 0.3$ |
| for $x_S$, | preferably $0.2 \leq x_S \leq 0.7$ |

$Q_{max}$ can be improved by controlling the mixing ratio of $MBi_2Nb_2O_9$ with respect to $Bi_3TiNbO_9$ according to the invention. When this mixing ratio is too low or too high, the effect on $Q_{max}$ improvements becomes insufficient. Although the respective molar ratios of Sr, Ba and Ca in the element M are not critical, it is understood that when $x_B$ or $x_C$ exceeds the upper limit of the aforesaid range, the effect on $Q_{max}$ improvements becomes insufficient. For the element M, it is particularly preferable to use at least one element of Sr and Ba because of having a much higher effect on $Q_{max}$ improvements.

The piezoelectric ceramic material of the invention includes a $Bi_3TiNbO_9$ crystal and/or an $MBi_2Nb_2O_9$ crystal which are each a bismuth layer compound. Usually, the $Bi_3TiNbO_9$ crystal and $MBi_2Nb_2O_9$ crystal are each in a single phase form. The $Bi_3TiNbO_9$ crystal is a orthorhombic crystal while the $MBi_2Nb_2O_9$ crystal is a pseudo-tetragonal crystal. Whether the piezoelectric material of the invention is in a $Bi_3TiNbO_9$ single crystal form or an $MBi_2Nb_2O_9$ single crystal form is determined depending on the amount of substitution x, with the boundary being x=ca.0.1 to 0.3. By the $MBi_2Nb_2O_9$ crystal used herein is meant an $SrBi_2Nb_2O_9$ crystal, a $BaBi_2Nb_2O_9$ crystal, and a $CaBi_2Nb_2O_9$ crystal. Wherever the $MBi_2Nb_2O_9$ crystal is present, at least one of these crystals must be present.

The piezoelectric ceramic material of the invention should preferably be composed only of the $Bi_3TiNbO_9$ crystal and/or the $MBi_2Nb_2O_9$ crystal, and especially be made up of the single phase of either crystal. However, the piezoelectric ceramic material of the invention may contain some foreign phases, or it is not necessarily homogeneous. For instance, the mixing ratios of all the crystals in the piezoelectric ceramic material are not necessarily identical.

The molar ratio of the aforesaid main component elements may more or less deviate from the aforesaid formula I. The composition represented by this formula I may be rewritten as $$(Bi_{3-x}M_x)(Nb_{1+x}Ti_{1-x})O_9$$

Here the ratio of M+Bi with respect to Nb+Ti is 3/2. However, a deviation of ca.±5% from this value is acceptable. In other words, the piezoelectric ceramic material of the invention should preferably be defined by $$(Bi_{3-x}M_x)_z(Nb_{1+x}Ti_{1-x})O_9 \quad\quad II$$

provided that $0.95 \leq z \leq 1.05$. It is here appreciated that the amount of oxygen, too, can change depending on the valence of the metal elements, oxygen deficiencies, etc. and, hence, the number of moles of oxygen in formula II is not necessarily 9.

For composition control of the piezoelectric ceramic material of the invention, it is unnecessary to vary Nb/(Nb+Ti) and M/(M+Bi) in perfect sync. For instance, the substitution of parameter x by y with respect to Nb and Ti in formula II gives $$(Bi_{3-x}M_x)_z(Nb_{1+y}Ti_{1-y})O_9 \quad\quad III$$

In this formula III according to the invention,

| for x and y, | $0 < x, y \leq 0.8$ |
| --- | --- |
| | preferably $0.05 \leq x, y \leq 0.8$ |
| | more preferably $0.1 \leq x, y \leq 0.7$ |
| for z, | $0.95 \leq z \leq 1.05$ |

However, perfectly independent alteration of x and y causes the effect of the invention to become slender. It is thus desired that $$x - 0.5 \leq y \leq x + 0.5$$

preferably $x - 0.3 \leq y \leq x + 0.3$ even preferably $x - 0.1 \leq y \leq x + 0.1$ most preferably y=x It is preferable that whenever Ba alone, and Ca alone is used as the element M, $$x - 0.3 \leq y \leq x + 0.3$$

In a typical example where x is not equal to y or other elements are added to the main component elements, the design of composition is on the basis of substitutional solid solution. For instance, this holds true for the case where the added elements are treated as elements for substitution of M in $MBi_2Nb_2O_9$.

In the aforesaid formula III, the molar ratio, M/(M+Bi), of M with respect to M+Bi is represented by x/3 where x corresponds to the mixing ratio x in the aforesaid formula I. Referring to formula III, let $x_S$, $x_B$ and $x_C$ stand for the molar ratios of Sr, Ba and Ca in the element M, respectively. Then, $$x = x_S + x_B + x_C$$

Accordingly, the molar ratios of Sr, Ba and Ca with respect to M+Bi are represented by $x_S/3$, $x_B/3$ and $x_C/3$, respectively. The ranges of $x_S$, $x_B$ and $x_C$ in formula III are the same as defined in conjunction with formula I.

In addition to the aforesaid main component elements, the piezoelectric ceramic material of the invention may contain other elements as subordinate components. Usually, the subordinate component elements should preferably be contained in the form of oxides. The total content of the subordinate component elements in the piezoelectric ceramic material of the invention should preferably be less than 1% by mass, and especially 0.8% by mass or less, as calculated on an oxide basis. When the content of the subordinate component elements is too much, $Q_{max}$ often diminishes. It is here appreciated that the content of the subordinate component elements, as calculated on an oxide basis, is determined on the premise that the subordinate component oxides are incorporated in the form of oxides in stoichiometric composition. Preferably but not exclusively, the subordinate component element used should be at least one of La, Ce, Pr, Nd, Pm, Sm, Eu, Gd, Tb, Dy, Ho, Er, Tm, Yb, Lu, Ta, Zr, Cr, Fe and W, and especially at least one of La, Pr, Nd and Gd. By the incorporation of these subordinate component elements, it is possible to achieve a further increase in $Q_{max}$. This effect on $Q_{max}$ improvements is much more enhanced especially when Sr is contained in the element M. To take full advantage of the effect on $Q_{max}$ improvements, it is preferable to use the subordinate component elements in an amount of 0.1% by mass or more as calculated on an oxide basis. It is here appreciated that the contents of these subordinate component elements, as calculated on an oxide basis, are determined on the premise that they are present in the states of $La_2O_3$, $CeO_2$, $Pr_6O_{11}$, $Nd_2O_3$, $Pm_2O_3$, $Sm_2O_3$, $Eu_2O_3$, $Gd_2O_3$, $Tb_4O_7$, $Dy_2O_3$, $Ho_2O_3$, $Er_2O_3$, $Tm_2O_3$, $Yb_2O_3$, $Lu_2O_3$, $Ta_2O_5$, $ZrO_2$, $Cr_2O_3$, $Fe_2O_3$ and $WO_3$.

In the most preferable embodiment of the invention, the subordinate component element or elements should be quite free from Pb. However, the presence of Pb in an amount of 0.5% by mass or less as calculated on a PbO basis is practically insignificant.

The crystal grains of the piezoelectric ceramic material of the invention are present in plate or acicular forms. Although the mean crystal grain diameter is not critical, yet it should be preferably 1 to 10 μm, and more preferably 3 to 5 μm as measured in the lengthwise direction. With too large crystal grains, any large enough electromechanical coupling factor can hardly be obtained due to decreased sintering density. With too small crystal grains, on the other hand, insufficient sintering results again in decreased sintering density.

The piezoelectric ceramic material of the invention is typically suitable for resonators operable in every mode from thickness extensional vibration mode to thickness shear vibration mode.

One embodiment of how to fabricate the piezoelectric ceramic material of the invention is now explained.

Powders of the starting oxides or the starting compounds that can be converted by firing into oxides, that is, carbonates, hydroxides, oxalates or nitrates, for instance, $SrCO_3$, $BaCO_3$, $CaCO_3$, $La_2O_3$, $La(OH)_3$, $Bi_2O_3$, $TiO_2$, $Nb_2O_5$, etc. are wet mixed together in a ball mill or the like.

Then, the mixture is calcined at about 650 to 1,000° C. for about 1 to 3 hours, and the resultant calcined product was slurried and wet pulverized in a ball mill or the like.

After completion of wet pulverization and drying, the powders of the calcined product were pressed at a pressure of about 100 to 400 MPa with the addition thereto of a small amount (of the order of 4 to 8% by mass) of water, thereby obtaining a compact. In this case, a binder such as polyvinyl alcohol may be added to the powders.

Then, the compact is fired to obtain a piezoelectric ceramic material. The firing temperature is preferably selected from the range of 950 to 1,250° C. and the firing time is preferably of the order of about 1 to 5 hours. The firing may be carried out in the atmosphere. Alternatively, the firing may be performed in an atmosphere having a partial pressure of oxygen lower or higher than that in the atmosphere, or in an atmosphere of pure oxygen.

EXAMPLE

Example 1

(M=Sr)

Piezoelectric ceramic samples shown in Table 1 were prepared according to the following procedure.

$Bi_2O_3$, $Nb_2O_5$, $TiO_2$ and $SrCO_3$ were provided as the starting materials for the main components, $La_2O_3$, $Pr_6O_{11}$, $Nd_2O_3$, $Gd_2O_3$, $Ta_2O_5$, $ZrO_2$, $Cr_2O_3$, $Fe_2O_3$ and $WO_3$ as the starting materials for the subordinate components, and $MnCO_3$ for the purpose of comparisons with the subordinate components. The powders of the starting main component materials were blended together in such a way as to provide the following composition as calculated on an oxide basis.

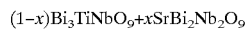

$(1-x)Bi_3TiNbO_9 + xSrBi_2Nb_2O_9$

The value of x in each sample is indicated in Table 1. The powders of the starting subordinate component materials were added to the starting main component materials. Table 1 also shows the contents, as calculated on an oxide basis, of the subordinate component elements in the piezoelectric ceramic samples.

These starting materials were wet mixed together for 15 hours in a ball mill using zirconia balls in pure water. Then, the mixture was fully dried, pressed, and calcined at 750 to 900° C. for 2 hours. The resultant calcined product was pulverized in a ball mill, dried, and granulated with the addition of a binder (polyvinyl alcohol) thereto. Using a uniaxial pressing machine, the resultant granulated powders were pressed with the application thereto of a pressure of 200 to 300 MPa into a plate form of compact having a plane size of 20 mm×20 mm and a thickness of ca. 1.5 mm. The obtained compact was thermally treated to burn out the binder, and then fired at 1,050 to 1,250° C. for 2 to 4 hours.

The resultant sintered compact was lapped to a thickness of 0.5 mm, and cut to a plane size of 15 mm×15 mm, thereby obtaining a thin sheet. Cu electrodes were deposited by evaporation on the upper and lower sides of this thin sheet. Then, an electric field of 5 to 15 MV/m was applied to the thin sheet for 1 to 30 minutes in a silicone oil bath of 150 to 300° C. for polarization treatment.

Then, the Cu electrodes were etched away using an aqueous solution of ferric chloride, and the thin sheet was thereafter ground to a thickness of 0.41 mm. Subsequently, the thin sheet was cut to a plane size of 7 mm×4.5 mm in such a way as to align the direction of polarization with the thickness direction, thereby obtaining a chip. For the evaluation of thickness extensional vibration, Ag electrodes were deposited by evaporation on the upper and lower sides of the chip. Each Ag electrode had a diameter of 1.5 mm and a thickness of 1 μm.

Using an impedance analyzer HP4194A, Hewlett-Packard Co., each sample was measured for $Q_{max}$ in the thickness extensional third vibration mode at about 16 MHz. The results are set out in Table 1.

TABLE 1

(M = Sr)

| Sample No. | x | Subordinate Component Type | Subordinate Component Content (% by mass) | $Q_{max}$ |
|---|---|---|---|---|
| 101 (comp.) | 0* | — | — | 0.1 |
| 102 | 0.2 | — | — | 5.2 |
| 103 | 0.4 | — | — | 4.3 |
| 104 | 0.5 | — | — | 3.4 |
| 105 | 0.7 | — | — | 3.0 |
| 106 | 0.8 | — | — | 2.3 |
| 107 (comp.) | 1.0* | — | — | 1.6 |
| 108 | 0.5 | La | 0.1 | 4.2 |
| 109 | 0.5 | La | 0.3 | 7.5 |
| 110 | 0.5 | Pr | 0.1 | 4.6 |
| 111 | 0.5 | Pr | 0.3 | 8.4 |
| 112 | 0.5 | Nd | 0.3 | 7.0 |
| 113 | 0.5 | Gd | 0.3 | 7.2 |
| 114 | 0.5 | Ta | 0.1 | 6.0 |
| 115 | 0.5 | Ta | 0.3 | 5.7 |
| 116 | 0.5 | Ta | 0.5 | 4.8 |
| 117 | 0.5 | Zr | 0.1 | 5.5 |
| 118 | 0.5 | Zr | 0.3 | 5.6 |
| 119 | 0.5 | Zr | 0.5 | 5.6 |
| 120 | 0.5 | Cr | 0.3 | 4.0 |
| 121 | 0.5 | Fe | 0.3 | 4.2 |
| 122 | 0.5 | W | 0.3 | 4.4 |
| 123 | 0.5 | Mn* | 0.3 | 0.5 |

*deviation from the range defined by and preferable in the invention

From Table 1, it is found that by mixing the given amount of $SrBi_2Nb_2O_9$ in $Bi_3TiNbO_9$ to form a solid solution, $Q_{max}$ is much more increased than could be achieved with the single phase of $Bi_3TiNbO_9$, and the single phase of $SrBi_2Nb_2O_9$. It is also found that by the incorporation of the subordinate component such as La, $Q_{max}$ is much more increased. As can be seen from the fact that the inventive samples set out in Table 1 have Curie points in the range of 450 to 940° C., sufficiently high Curie points are obtainable according to the invention.

Shown in FIG. 1 are the results of powder X-ray diffraction analysis of a plurality of samples represented by $$(1-x)Bi_3TiNbO_9+xSrBi_2Nb_2O_9$$

where x stands for different values. From FIG. 1, it is found that single-phase sintered compacts in perfect solid solution forms, whatever of value of x indicative of the mixing ratio, are achievable. In FIG. 1, orthorhombic crystals occur at $x \leq 0.2$ and pseudo-tetragonal crystals at $x \geq 0.3$.

Example 2

(M=Ba)

Piezoelectric ceramic samples shown in Table 2 were prepared according to the following procedure.

$Bi_2O_3$, $Nb_2O_5$, $TiO_2$ and $BaCO_3$ were provided as the starting materials for the main components. The powders of the starting main component materials were blended together in such a way as to provide the following composition as calculated on an oxide basis.

$$(1-x)Bi_3TiNbO_9+xBaBi_2Nb_2O_9$$

The value of x in each sample is indicated in Table 2. The piezoelectric ceramic samples were obtained as in Example 1 with the exception of using these starting materials.

Each sample was measured for $Q_{max}$ as in Example 1. The results are set out in Table 2.

TABLE 2

(M = Ba)

| Sample No. | x | $Q_{max}$ |
|---|---|---|
| 201 (comp.) | 0* | 0.1 |
| 202 | 0.1 | 6.8 |
| 203 | 0.3 | 4.4 |
| 204 | 0.4 | 3.2 |
| 205 | 0.5 | 2.1 |
| 206 (comp.) | 0.6* | 0.0 |

*deviation from the range defined herein

From Table 2, it is found that by mixing the given amount of $BaBi_2Nb_2O_9$ in $Bi_3TiNbO_9$ to form a solid solution, $Q_{max}$ is much more increased than could be achieved with the single phase of $Bi_3TiNbO_9$. As can be seen from the fact that the inventive samples set out in Table 2 have Curie points in the range of 450 to 940° C., sufficiently high Curie points are obtainable according to the invention.

Figure 2:
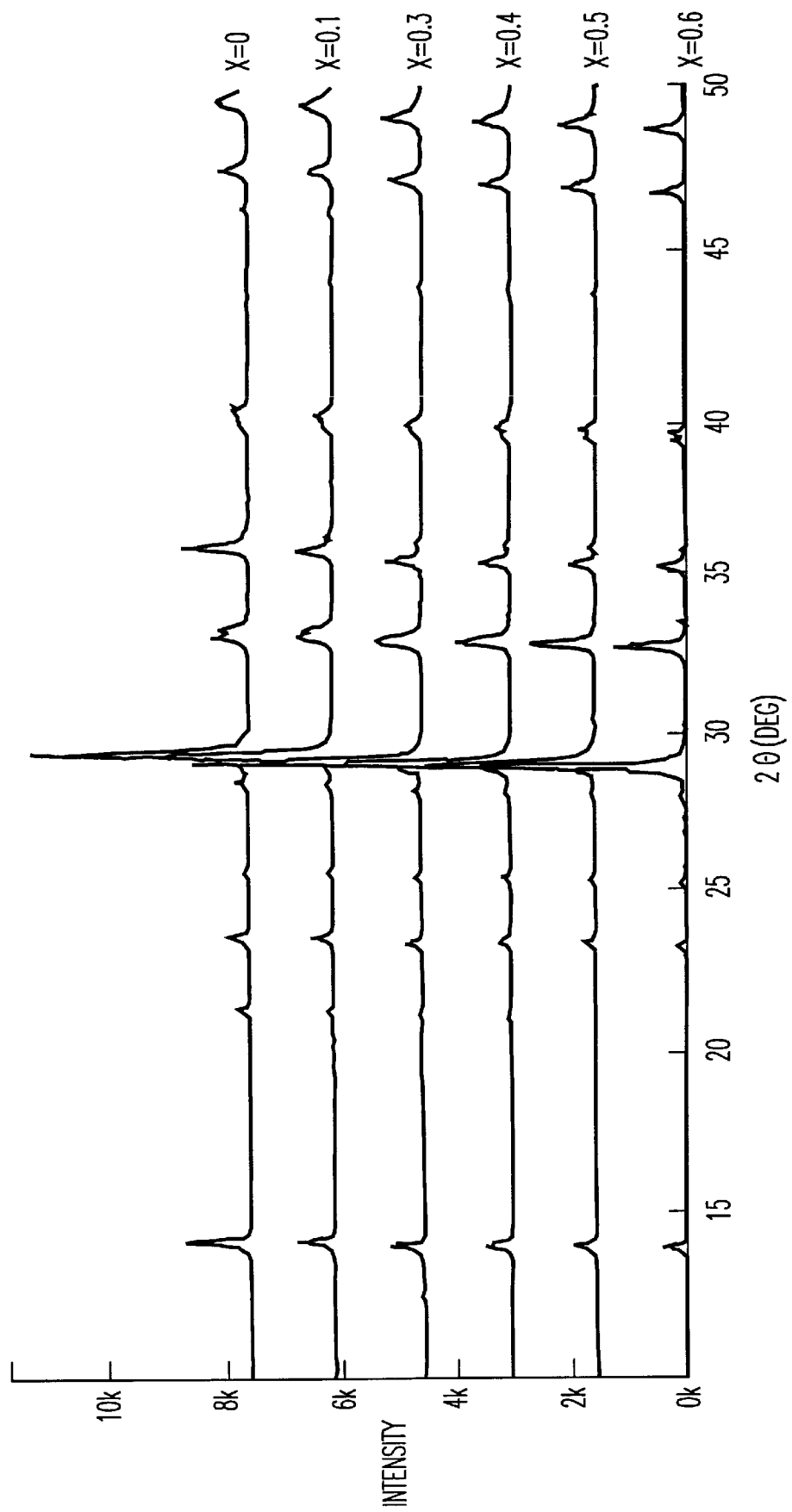
FIG. 2 is a chart illustrative of the results of analysis of powder X-ray diffraction of $(1-x)Bi_3TiNbO_9 + xBaBi_2Nb_2O_9$ with varying x values.

Shown in FIG. 2 are the results of powder X-ray diffraction analysis of a plurality of samples represented by $$(1-x)Bi_3TiNbO_9+xBaBi_2Nb_2O_9$$

where n stands for different values. From FIG. 2, it is found that single-phase sintered compacts in perfect solid solution forms, whatever of value of x indicative of the mixing ratio, are achievable. In FIG. 2, orthorhombic crystals occur at $x \leq 0.1$ and pseudo-tetragonal crystals at $x \geq 0.3$.

Figure 3:
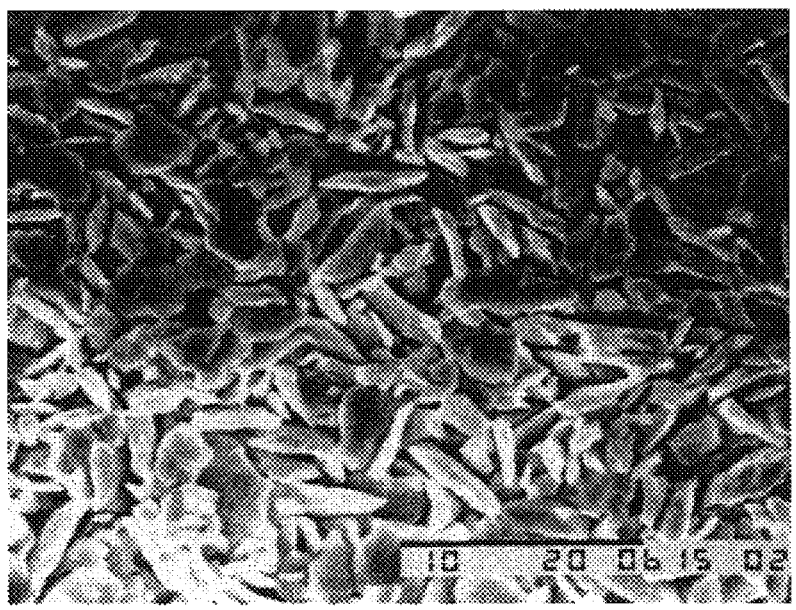
FIG. 3 is a drawing substitute photograph illustrative of grain structure, viz., a scanning electron microscope photograph of a section of one ceramic material.
Figure 4:
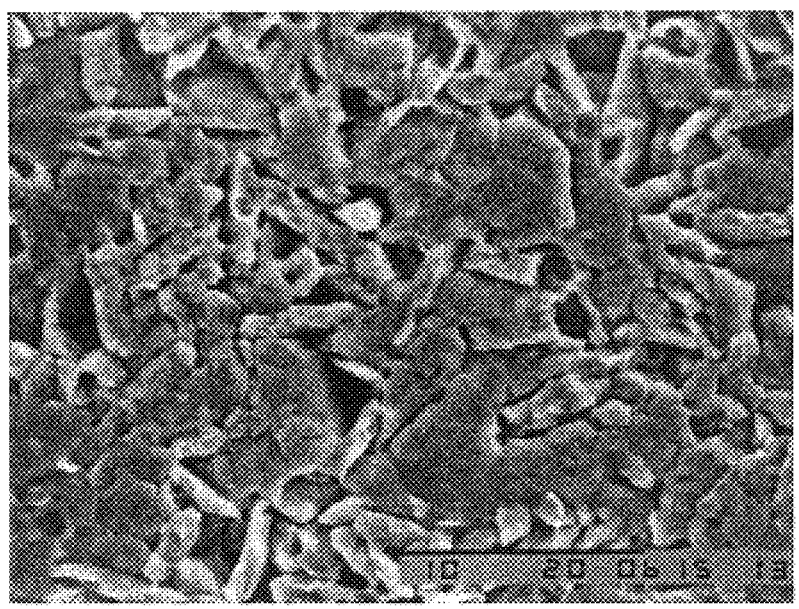
FIG. 4 is a drawing substitute photograph illustrative of grain structure, viz., a scanning electron microscope photograph of a section of another ceramic material.
Figure 5:
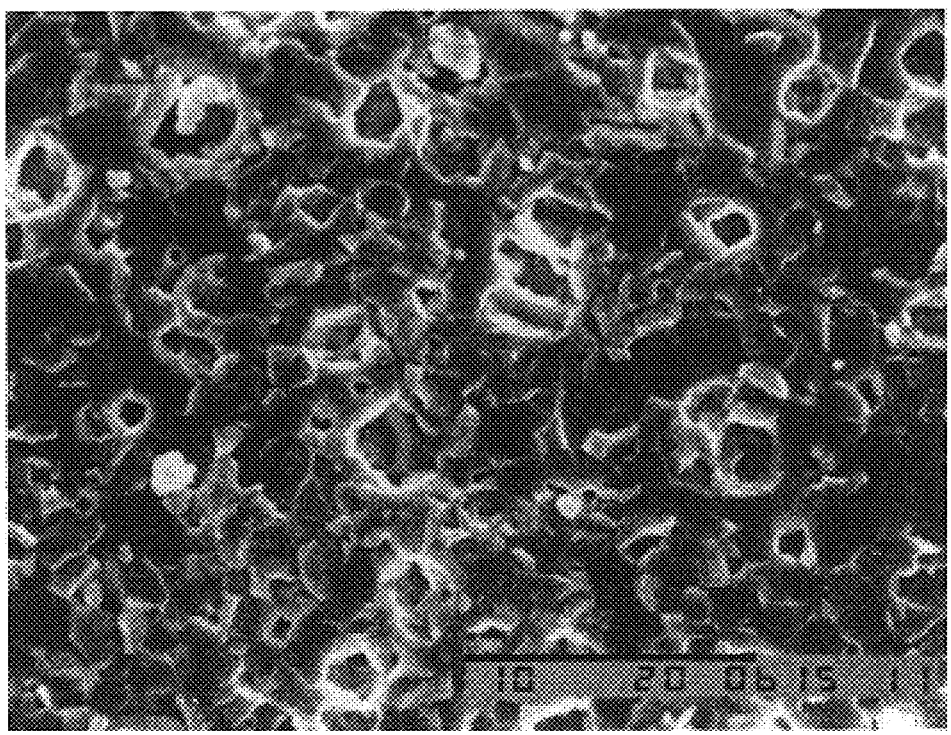
FIG. 5 is a drawing substitute photograph illustrative of grain structure, viz., a scanning electron microscope photograph of a section of yet another ceramic material.

Scanning electron microscope photographs taken of the sections of sample Nos. 201, 202 and 206 after chemical etching are attached hereto as FIGS. 3, 4 and 5, respectively. It is seen that inventive sample No. 202 having an increased $Q_{max}$ is made up of plate crystal grains having an increased degree of grain growth; however, comparative sample No. 201 has a reduced degree of grain growth although it is made up of plate crystal grains. It is also seen that comparative sample No. 206 is made up of amorphous crystal grains having a reduced degree of grain growth.

Example 3

(M=Sr+Ba)

Piezoelectric ceramic samples shown in Table 3 were prepared according to the following procedure.

$Bi_2O_3$, $Nb_2O_5$, $TiO_2$, $SrCO_3$ and $BaCO_3$ were provided as the starting materials for the main components, and $La_2O_3$, $Pr_6O_{11}$, $Nd_2O_3$, $Gd_2O_3$ and $Ta_2O_5$ as the starting materials for the subordinate components. The powders of these starting main component materials were blended together in such a way as to provide the following composition as calculated on an oxide basis.

$$(1-x_S-x_B)Bi_3TiNbO_9+(x_S)SrBi_2Nb_2O_9+(x_B)BaBi_2Nb_2O_9$$

The values of $x_S$ and $x_B$ in each sample are shown in Table 3. The powders of the starting subordinate component materials were added to the starting main component materials. Table 3 also indicates the contents, as calculated on an oxide basis, of the subordinate component elements in the piezoelectric ceramic samples. The piezoelectric ceramic samples were obtained as in Example 1 with the exception of using these starting materials.

Each sample was measured for $Q_{max}$ as in Example 1. The results are set out in Table 3.

TABLE 3

(M = Sr, Ba)

| Sample No. | $x_S$ | $x_B$ | Subordinate Component Type | Content (% by mass) | $Q_{max}$ |
|---|---|---|---|---|---|
| 301 (comp.) | 0* | 0* | — | — | 0.1 |
| 302 | 0.05 | 0.05 | — | — | 4.5 |
| 303 | 0.05 | 0.10 | — | — | 5.0 |
| 304 | 0.10 | 0.05 | — | — | 4.9 |
| 305 | 0.10 | 0.10 | — | — | 6.4 |
| 306 | 0.125 | 0.125 | — | — | 7.3 |
| 307 | 0.15 | 0.05 | — | — | 4.9 |
| 308 | 0.15 | 0.15 | — | — | 7.6 |
| 309 | 0.20 | 0.20 | — | — | 5.5 |
| 310 | 0.40 | 0.10 | — | — | 4.5 |
| 311 (comp.) | 1.00* | 0 | — | — | 1.6 |
| 312 | 0.10 | 0.10 | La | 0.3 | 8.5 |
| 313 | 0.10 | 0.10 | Pr | 0.3 | 9.3 |
| 314 | 0.10 | 0.10 | Nd | 0.3 | 8.0 |
| 315 | 0.10 | 0.10 | Gd | 0.3 | 8.1 |
| 316 | 0.10 | 0.10 | Ta | 0.1 | 6.5 |

*deviation from the range defined herein

From Table 3, it is found that by mixing the given amount of $MBi_2Nb_2O_9$ in $Bi_3TiNbO_9$ to form a solid solution, $Q_{max}$ is much more increased than could be achieved with the single phase of $Bi_3TiNbO_9$. It is also found that even when both Sr and Ba are used as the element M, $Q_{max}$ is by far much more increased by the incorporation of the subordinate component element such as La. As can be seen from the fact that the inventive samples set out in Table 3 have Curie points in the range of 450 to 940° C., sufficiently high Curie points are obtainable according to the invention. The samples shown in Table 3 were all in single phase states.

Example 4

(M=Ca)

Piezoelectric ceramic samples shown in Table 4 were prepared according to the following procedure.

$Bi_2O_3$, $Nb_2O_5$, $TiO_2$ and $CaCO_3$ were provided as the starting materials for the main components. The powders of the starting main component materials were blended together in such a way as to provide the following composition as calculated on an oxide basis.

$(1-x)Bi_3TiNbO_9+xCaBi_2Nb_2O_9$

The value of x in each sample is indicated in Table 4. The piezoelectric ceramic samples were obtained as in Example 1 with the exception of using these starting materials.

Each sample was measured for $Q_{max}$ as in Example 1. The results are set out in Table 4.

TABLE 4

(M = Ca)

| Sample No. | x | $Q_{max}$ |
|---|---|---|
| 401 (comp.) | 0* | 0.1 |

TABLE 4-continued (M = Ca)

| Sample No. | x | $Q_{max}$ |
|---|---|---|
| 402 | 0.1 | 2.6 |
| 403 | 0.2 | 4.5 |
| 404 | 0.3 | 2.3 |
| 405 (comp.) | 0.4* | 1.5 |
| 406 (comp.) | 0.5* | 0.8 |
| 407 (comp.) | 0.6* | −0.5 |

*deviation from the range defined herein

From Table 4, it is found that by mixing the given amount of $CaBi_2Nb_2O_9$ in $Bi_3TiNbO_9$ to form a solid solution, $Q_{max}$ is much more increased than could be achieved with the single phase of $Bi_3TiNbO_9$. As can be seen from the fact that the inventive samples set out in Table 4 have Curie points in the range of 450 to 940° C., sufficiently high Curie points are obtainable according to the invention. The samples shown in Table 4 were all in single phase states.

Whereas the invention has been shown and described in connection with the preferred embodiments thereof, it should be understood that many modifications, substitutions and additions may be made which are within the intended scope of the appended claims.

Japanese Patent Application Nos. 2000-228514, 2000-296992, 2000-241826 and 2001-083778 are incorporated herein by reference.

What we claim is:

1. A piezoelectric ceramic material comprising a solid solution comprising Bi, Ti, M and Nb as main component elements, wherein M represents at least one element selected from the group consisting of Sr, Ba and Ca, wherein the molar ratio as oxides of said main component elements is given $(Bi_{3-x}M_x)_z(Nb_{1+y}Ti_{1-y})O_9$ provided that $0<x$, $y \leq 0.8$, and $0.95 \leq z \leq 1.05$, and $0 \leq x_B \leq 0.5$ and $0 \leq x_C \leq 0.4$, wherein the molar ratio of Ba/(M+Bi) is given by $x_B/3$ and a molar ratio of Ca/(M+Bi) is given by $x_C/3$, wherein said solid solution further includes a bismuth layer compound selected from the group consisting of $Bi_3TiNbO_9$ crystal, $MBi_2Nb_2O_9$ crystal and mixtures thereof.

2. The piezoelectric ceramic material according to claim 1, wherein $x-0.5 \leq y \leq x+0.5$.

3. The piezoelectric ceramic material according to claim 1, which further contains as a subordinate component element at least one element selected from La, Ce, Pr, Nd, Pm, Sm, Eu, Gd, Tb, Dy, Ho, Er, Tm, Yb, Lu, Ta, Zr, Cr, Fe and W.

4. The piezoelectric ceramic material according to claim 1 of the formula $(1-x)Bi_3TiNbO_9+xMBi_2Nb_2O_9$ wherein x is the molar ratio of the mixing ratio of $MBi_2Nb_2O_9$ with respect to the total of $Bi_3TiNbO_9$ and $MBi_2Nb_2O_9$, $x=x_s+x_B+x_C$, $x_s$ represent the mixing ratio of $SrBi_2Nb_2O_9$, $x_B$ represent the mixing ratio of $BaBi_2Nb_2O_9$ and $x_C$ represent the mixing ratio of $CaBi_2Nb_2O_9$, $x=x_s+x_B+x_C$ and $0<x \leq 0.8$ $0 \leq x_B < 0.5$ $0 \leq x_C < 0.4$ $0.2 \leq x_S \leq 0.7$.

5. The piezoelectric ceramic material according to claim 4, wherein $0.05 \leq x \leq 0.8$ $0 \leq x_B \leq 0.4$ $0 \leq x_C \leq 0.3$.

6. The piezoelectric ceramic material according to claim 4, wherein $0.1 \leq x \leq 0.7$ $0 \leq x_B \leq 0.3$.

7. The piezoelectric ceramic material according to claim 1, wherein Pb is present in an amount of 0.5% by mass or less, calculated on a PbO basis.

8. The piezoelectric ceramic material according to claim 1, free from Pb.

9. The piezoelectric ceramic material according to claim 1, wherein the material comprises grains present in plate or acicular form.

10. The piezoelectric ceramic material according to claim 9, wherein the grain diameter is 1 to 10 $\mu$m, as measured in a lengthwise direction.

11. The piezoelectric ceramic material according to claim 10, wherein the grain diameter is 3 to 5 $\mu$m.

\* \* \* \* \*

UNITED STATES PATENT AND TRADEMARK OFFICE
CERTIFICATE OF CORRECTION

PATENT NO. : 6,685,850 B2  Page 1 of 1
DATED : February 3, 2004
INVENTOR(S) : Masaru Nanao et al.

It is certified that error appears in the above-identified patent and that said Letters Patent is hereby corrected as shown below:

<u>Title page,</u>
Item [75], should read:
-- [75] Inventors: Masaru Nanao, Tokyo (JP);
Masakazu Hirose, Tokyo (JP);
Takeo Tsukada, Tokyo (JP) --.

Signed and Sealed this

Eighteenth Day of May, 2004

JON W. DUDAS
*Acting Director of the United States Patent and Trademark Office*